(12) United States Patent
Takita (10) Patent No.: US 6,463,941 B1
(45) Date of Patent: Oct. 15, 2002

(54) CONCENTRATION CONTROL APPARATUS OF LIQUID CHEMICAL

(75) Inventor: Shinya Takita, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/459,009

(22) Filed: Dec. 10, 1999

(30) Foreign Application Priority Data

Dec. 11, 1998 (JP) .............................. 10-353144

(51) Int. Cl.⁷ ................................. B08B 3/04
(52) U.S. Cl. .................. 134/57 R; 134/58 R; 134/113; 134/100.1; 134/902
(58) Field of Search .................. 134/56 R, 57 R, 134/58 R, 113, 94.1, 99.1, 100.1, 902; 222/135

(56) References Cited

U.S. PATENT DOCUMENTS

| | | | |
|---|---|---|---|
| 2,621,673 A | * | 12/1952 | Hodgens, Jr. |
| 3,074,277 A | * | 1/1963 | Hill |
| 3,319,637 A | * | 5/1967 | Gore et al. |
| 4,208,219 A | * | 6/1980 | Etscheid |
| 4,285,352 A | * | 8/1981 | McMahon et al. |
| 5,370,743 A | * | 12/1994 | Usui et al. |
| 5,439,569 A | * | 8/1995 | Carpio |
| 5,722,441 A | * | 3/1998 | Teramoto |
| 6,158,447 A | * | 12/2000 | Kamikawa et al. |

FOREIGN PATENT DOCUMENTS

| | | |
|---|---|---|
| JP | 60-223131 | 11/1985 |
| JP | 4-24553 | 4/1992 |
| JP | 5-121388 | 5/1993 |
| JP | 7-20052 | 1/1995 |
| JP | 8-78380 | 3/1996 |
| JP | 10-223598 | 8/1998 |
| JP | 10-223599 | 8/1998 |
| JP | 11-173983 | 7/1999 |
| JP | 11-224874 | 8/1999 |
| JP | 2000-124185 | 4/2000 |

* cited by examiner

*Primary Examiner*—Frankie L. Stinson
(74) *Attorney, Agent, or Firm*—Katten Muchin Zavis Rosenman (57) ABSTRACT

A concentration control apparatus of a liquid chemical is provided, which is capable of real-time concentration/composition control of a liquid chemical without sampling the same. This apparatus is comprised of (a) a liquid chemical supplier section for supplying a liquid chemical; the liquid chemical being a mixture of source liquids; (b) a wafer treater section for applying a specific treatment to a semiconductor wafer using the liquid chemical supplied from the liquid chemical supplying section; the wafer treating section being connected to the liquid chemical supplying section through a communication line; (c) a concentration detector located in the communication line for detecting the concentration and/or composition of the liquid chemical flowing through the communication line; the concentration detector outputting a data signal about the detected concentration and/or composition of the liquid chemical; and (d) a data processor section for processing the data signal outputted from the concentration detector to output a control signal to the liquid chemical supplier section. The concentration and/or composition of the liquid chemical supplied from the liquid chemical supplier section is/are controlled by the control signal outputted from the data processor section.

12 Claims, 7 Drawing Sheets

CONCENTRATION CONTROL APPARATUS OF LIQUID CHEMICAL

BACKGROUND OF THE INVENTION

1. Field of the Invention

The present invention relates to a concentration control apparatus and more particularly, to a concentration control apparatus of a liquid chemical that is capable of real-time measurement and management of the concentration and/or composition of a liquid chemical used for various treatments, such as wafer etching, wafer cleaning, and so on, in semiconductor device fabrication.

2. Description of the Prior Art

Conventionally, various cleaning apparatuses for cleaning a semiconductor wafer have been known, an example of which is disclosed in the Japanese Non-Examined Patent Publication No. 5-121388 published in May 1993. This prior-art cleaning apparatus is comprised of a wafer heating means for heating a semiconductor wafer, a wafer holding means for holding the wafer, and a cleaning liquid diffusing means for diffusing a cleaning liquid over the wafer held by the wafer holding means.

Figure 1:
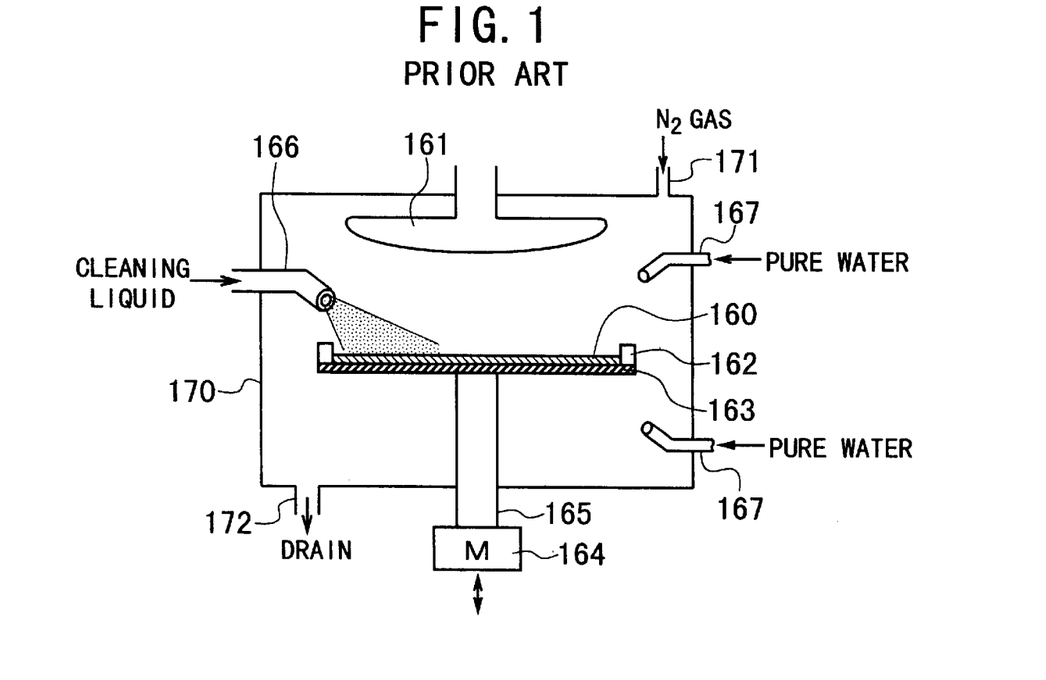
FIG. 1 is a schematic cross-sectional view of a prior-art cleaning apparatus of a semiconductor wafer.

FIG. 1 schematically shows the configuration of this prior-art cleaning apparatus.

As seen from FIG. 1, this apparatus has a halogen lamp 161 for heating an underlying semiconductor wafer 160, a wafer holder 162 for holding the wafer 160, an arm 163 for operating the holder 162, a motor 164 for rotating the wafer 160 in the horizontal plane, a rotational shaft 165 for transmitting the rotation motion of the motor 164 to the wafer 160 through the arm 163, a nozzle 166 for spraying a liquid cleaning chemical toward the wafer 60 held by the holder 162, the two nozzles for spraying pure water toward the wafer 60 to rinse the same. The lamp 161, the wafer holder 162, the arm 163, and the nozzles 166 and 167 are provided in a chamber 170. The motor 164 is located outside the chamber 170. The rotational shaft 165 penetrates the bottom wall of the chamber 170.

On operation, the wafer 160 held by the holder 162 is heated by the halogen lamp 161 in the chamber 170 while supplying a nitrogen ($N_2$) gas through a gas port 171 of the chamber 170 and rotating the wafer 160 by the motor 164 in the horizontal plane. Then, a specific cleaning liquid is sprayed from the nozzle 166 toward the wafer 160, thereby cleaning the wafer 160. The drain generated in the chamber 170 is flown out of the chamber 170 through a drain port 172. After the cleaning process is completed, pure water is sprayed from the nozzles 167 toward the wafer 160, thereby rinsing the wafer 160.

With the prior-art cleaning apparatus shown in FIG. 1, since the halogen lamp 161 is provided in the chamber 170, the wafer 160 can be heated to a specific temperature in a short time during the cleaning process. Also, the $N_2$ gas is introduced into the chamber 170 during the cleaning process and therefore, the cleaning atmosphere is stabilized, resulting in highly-reproducible cleaning operation.

On the other hand, various concentration control apparatuses for controlling the concentration of liquid chemicals been known. An example of the apparatuses of this sort is disclosed in the Japanese Non-Examined Patent Publication No. 60-223131 published in Nov. 1985. In this apparatus, the concentration of a cleaning liquid stored in a container is detected or monitored. Based on the detection result of the concentration thus obtained, the supply of source liquids to the container is controlled to stabilize the concentration of the liquid in the container. Taking the fact that the concentration detection operation necessitates a little time (i.e., a little time lag) into consideration and it is performed intermittently, the concentration control includes prediction of the concentration change to occur in the container after the detection of the liquid concentration (i.e., at the concentration detection operation next time).

Figure 2:
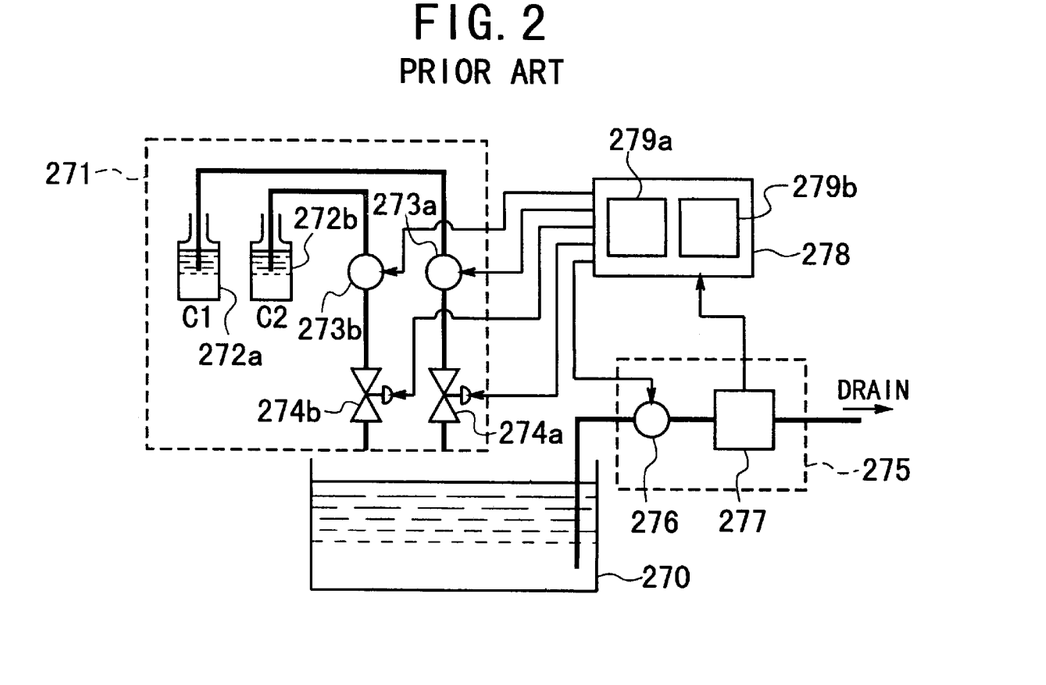
FIG. 2 is a schematic cross-sectional view of a prior-art concentration control apparatus of a liquid chemical.

FIG. 2 schematically shows the configuration of this prior-art concentration control apparatus.

As seen from FIG. 2, this prior-art apparatus has a storage container 270 in which a specific cleaning liquid CO having a specific concentration is stored. A source liquid supplying section 271 is provided over the container 270 for supplying two source liquids C1 and C2 to the container 270. The section 271 includes two storage tanks 272a and 272b in which the source liquids C1 and C2 are respectively stored, two valves 273a and 273b located respectively in the flow paths communicating with the tanks 272a and 272b, and two valves 274a and 274b located respectively in these flow paths. The section 271 supplies the source liquids C1 and C2 to the container 270 while controlling the flow rates of the liquids C1 and C2 by using the pumps 273a and 273b and the valves 274a and 274b.

The storage container 270 is equipped with a concentration monitoring section 275 for monitoring or detecting the concentration of the cleaning liquid CO in the container 270. The section 275 includes a pump 276 for pumping up the solution CO from the container 270 for sampling the same, and a monitoring device 277 for monitoring the concentration of the liquid CO thus pumped up.

A control section 278 is provided between the supplying section 271 and the monitoring section 275. The control section 278 controls the operation of the supplying section 271 according to the output of the monitoring section 275. Specifically, the control section 278 has a feedback control system 279a and a predictive control system 279b. The section 278 controls the concentration of the cleaning liquid CO in the container 270 under the cooperation of these systems 279a and 279b.

In the monitoring operation of the monitoring section 275, the pump 276 is activated to deliver the liquid CO in the container 270 to the monitoring device 277 for the purpose of sampling the same. Then, after a little time period passes required for detecting the concentration, the value of the concentration is read out.

The concentration data thus obtained in the monitoring section 275 is sent to the control section 278. Then, the control section 278 predicts the concentration change that will occur in the container 270 at the next-time monitoring operation, and controls the valves 274a and 274b and the pumps 273a and 273b so as to increase or decrease the supply rates of the source liquids C1 and C2 according to the result of the prediction operation.

With the above-described prior-art apparatuses shown in FIGS. 1 and 2, however, the following problems occur.

In single-wafer treating apparatuses such as single-wafer etchers designed for treating a single semiconductor wafer in each step, an advantage that the treatment condition can be easily controlled as desired arises. However, if an easily-decomposable liquid chemical or a mixture of several liquid chemicals is used as a treating agent, the prior-art apparatus shown in FIG. 1 has a problem that it is unable to find the deterioration and/or abnormal initial concentration of the agent in early stages. This is because the apparatus has no means for detecting or monitoring the concentration change of the agent during the ongoing treatment step for each wafer.

On the other hand, the prior-art apparatus shown in FIG. 2 has the monitoring section 275 for monitoring the concentration of the cleaning liquid CO stored in the container 270. Therefore, the above-described problem of the prior-art apparatus of FIG. 1 does not occur. However, the sampling of the liquid CO from the container 270 by the monitoring section 275 causes some pressure loss in the supply lines (not shown) of the liquid CO to a specific cleaning chamber. As a result, not only the liquid CO is required in surplus but also the required amount of the liquid CO for each cleaning step tends to fluctuate.

SUMMARY OF THE INVENTION

Accordingly, an object of the present invention is to provide a concentration control apparatus of a liquid chemical that is capable of real-time concentration/composition control of a liquid chemical without sampling the same.

Another object of the present invention is to provide a concentration control apparatus of a liquid chemical that makes it possible to find the deterioration of a liquid chemical and the abnormal concentration or composition thereof immediately.

Still another object of the present invention is to provide a concentration control apparatus of a liquid chemical that is capable of precise control of the concentration and/or composition of a liquid chemical.

A further object of the present invention is to provide a concentration control apparatus of a liquid chemical that minimizes the damage to be caused by the unallowable concentration and/or composition of a liquid chemical.

The above objects together with others not specifically mentioned will become clear to those skilled in the art from the following description.

A concentration control apparatus of a liquid chemical according to the present invention is comprised of
  (a) a liquid chemical supplier section for supplying a liquid chemical; the liquid chemical being a mixture of source liquids;
  (b) a wafer treater section for applying a specific treatment to a semiconductor wafer using the liquid chemical supplied from the liquid chemical supplying section; the wafer treating section being connected to the liquid chemical supplying section through a communication line;
  (c) a concentration detector located in the communication line for detecting the concentration and/or composition of the liquid chemical flowing through the communication line; the concentration detector outputting a data signal about the detected concentration and/or composition of the liquid chemical; and
  (d) a data processor section for processing the data signal outputted from the concentration detector to output a control signal to the liquid chemical supplier section.

The concentration and/or composition of the liquid chemical supplied from the liquid chemical supplier section is/are controlled by the control signal outputted from the data processor section.

With the concentration control apparatus of a liquid chemical according to the present invention, the liquid chemical supplier section for supplying a liquid chemical is connected to the wafer treater section for applying a specific treatment to a semiconductor wafer suing the liquid chemical by the communication line. Also, the concentration detector is located in the communication line to detect the concentration and/or composition of the liquid chemical flowing through the communication line.

Accordingly, real-time concentration/composition control of a liquid chemical can be realized without sampling the same. This solves the sampling-induced problem of the above-described prior-art apparatus shown in FIG. 2.

Also, since the concentration/composition of the liquid chemical can be real-time monitored by the concentration detector located in the communication line, the deterioration of the liquid chemical and the abnormal concentration or composition thereof can be found immediately. This minimizes the damage to be caused by the unallowable concentration and/or composition of the liquid chemical.

Furthermore, based on the data signal about the concentration and/or composition of the liquid chemical, the data processor section outputs in real time the control signal to the liquid chemical supplier section, thereby controlling the concentration and/or composition of the liquid chemical supplied from the liquid chemical supplier section. As a result, the concentration/composition of the liquid chemical can be controlled precisely.

In the present invention, any liquid or any liquid chemical substance may be used as each of the source liquids. Typically, the liquid chemical supplied from the liquid chemical supplier section is a mixture of two or more liquid chemical substances. However, this liquid chemical may be a diluted chemical substance, in which, for example, one of the two source liquids is a liquid chemical substance such as hydrogen fluoride (HF) and the other is a diluting liquid such as pure water.

Typically, each of the source liquids is a liquid chemical substance necessary for producing the desired liquid chemical in the liquid chemical supplier section. Usually, the liquid chemical substance contains a single component. For example, undiluted sulfuric acid ($H_2SO_4$), 30% -hydrogen peroxide solution, or the like may be used. However, the liquid chemical substance may contain two or more components.

The liquid chemical supplier section may have any configuration if it can supplies a liquid chemical and the concentration and/or composition of the liquid chemical can be controlled by the control signal outputted from the data processor section.

The wafer treater section may have any configuration if it is used for applying a specific treatment to a semiconductor wafer using the liquid chemical supplied from the liquid chemical supplying section.

The concentration detector may have any configuration if it is located in the communication line and it detects the concentration and/or composition of the liquid chemical flowing through the communication line to thereby output a data signal about the detected concentration and/or composition of the liquid chemical.

The data processor section may have any configuration if it processes the data signal outputted from the concentration detector to thereby output a control signal to the liquid chemical supplier section.

In a preferred embodiment of the apparatus according to the invention, the liquid chemical is a cleaning liquid for cleaning the semiconductor wafer. In this embodiment, for example, 89% -sulfuric acid and 31% hydrogen peroxide solution are used as the source liquids, thereby producing a well-known sulfuric-peroxide mixture (SPM) as the liquid chemical in the liquid chemical supplier section. Alternately, 29% - ammonia solution and 31% hydrogen peroxide solution are used as the source liquids, thereby producing a well-known ammonia-peroxide mixture (APM) as the liquid chemical in the liquid chemical supplier section.

In another preferred embodiment of the apparatus according to the invention, the liquid chemical is an etching liquid for etching the semiconductor wafer. In this embodiment, for example, 50%-hydrogen fluoride (HF) and pure water are used as the source liquids, thereby producing a well-known 0.3% -diluted hydrogen fluoride (DHF) as the liquid chemical in the liquid chemical supplier section.

In still another preferred embodiment of the apparatus according to the invention, the liquid chemical supplier section is comprised of storage tanks for storing the source liquids, and pumps respectively connected to the storage tanks. The pumps are controlled by the control signal outputted from the data processor section in such a way that the source liquids stored in the tanks are mixed together to have a desired ratio. The mixture of the source liquids is supplied to the wafer treater section as the liquid chemical.

It is preferred that a reference tank for storing a reference liquid is additionally provided for supplying the reference liquid to the concentration detector. The reference liquid is used for calibration. Alternately, a pure water tank for storing pure water may be additionally provided, in which the pure water is supplied to the concentration detector for calibration.

In a further preferred embodiment of the apparatus according to the invention, the concentration detector measures molarities of the source liquids contained in the liquid chemical by detecting an absorption wavelength or absorption characteristic of the liquid chemical using a ultraviolet, visible, or near-infrared spectrophotometer.

In a still further preferred embodiment of the apparatus according to the invention, the data processor section is comprised of a data converter and a pump controller. The data converter converts the control signal from the data signal about the concentration/composition of the liquid chemical to the control signal. The pump controller controls pumping rates of the source liquids according to the control signal.

In this embodiment, preferably, the data processor section compares concentrations or composition of the source liquids contained in the liquid chemical with predetermined values, and produces correction values for the source liquids based on result of comparison. The pump controller changes the pumping rates of the source liquids according to the correction values.

It is preferred that the data processor section has a specific stabilization period of time, and the correction values are produced after the stabilization period passes. In this case, it is preferred that the data processor section performs only a displaying operation of concentration values during the stabilization period.

Preferably, the data processor section performs the production operation of the correction values after each stabilization period.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 3:
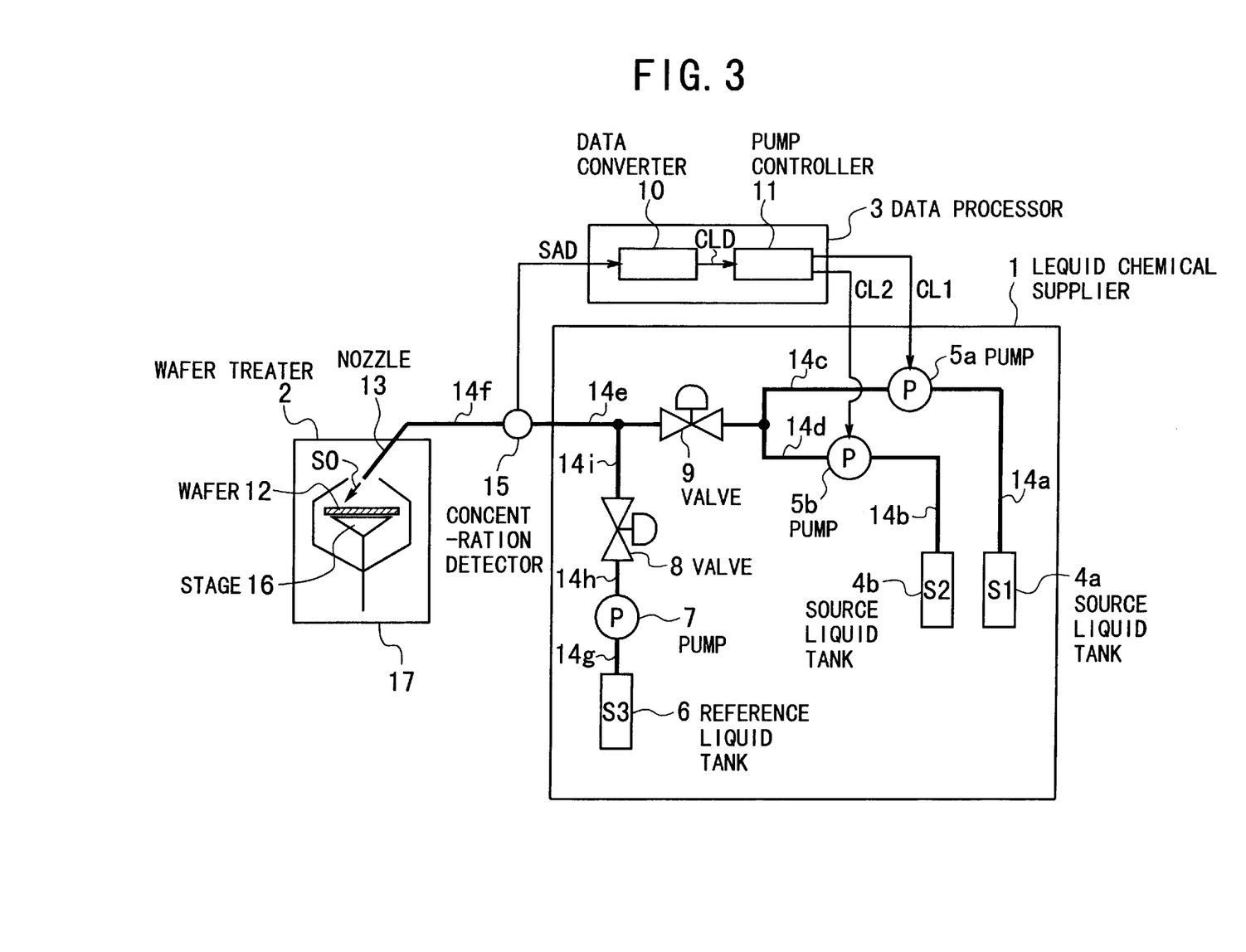
FIG. 3 is a schematic cross-sectional view of a concentration control apparatus of a liquid chemical according to a first embodiment of the present invention.

A concentration control apparatus of liquid chemicals according to a first embodiment of the present invention is shown in FIG. 3, which is comprised of a liquid chemical supplier section 1, a wafer treater section 2, and a data processor section 3.

In the liquid chemical supplier section 1, storage tanks 4a and 4b are provided for storing source liquids S1 and S2, respectively. Pumps 5a and 5b are respectively connected to the tanks 4a and 4b through communication lines or pipes 14a and 14b. The pipes 14a and 14b are coupled together and connected in common to a valve 9. In other words, the pumps 5a and 5b are connected in common to the valve 9 through the pipes 14c and 14d. The valve 9 is further connected to a concentration detector 15 through a communication line or pipe 14e. The detector 15 is further connected to a nozzle 13 of the wafer treater section 2 through a communication line or pipe 14f.

The source liquids S1 and S2 stored in the tanks 4A AND 4B are respectively sucked up by the pumps 5a and 5b at specific suction or pumping rates while the valve 9 is opened. Then, they are automatically mixed with each other at the coupling part of the pipes 14c and 14d before the valve 9, thereby producing the mixture of these liquids S1 and S2 as a liquid chemical SO. The mixture of the liquids S1 and S2 (i.e., the liquid chemical SO) is sent to the nozzle 13 through the concentration detector 15 and then, it is sprayed from the nozzle 13 toward a semiconductor wafer 12 located in the wafer treater section 2.

The liquid chemical SO is, for example, a cleaning liquid for cleaning the wafer 12 or an etching liquid for etching the same.

Moreover, in the liquid chemical supplier section 1, a storage tank 6 is provided for storing a reference liquid S3. A pump 7 is connected to the tank 6 through a communication line or pipe 14g. The pump 7 is further connected to a valve 8 through a communication line or pipe 14h. The valve 8 is further connected to the pipe 14e communicating with the concentration detector 15 and the nozzle 13 through a communication line or pipe 14i.

The reference liquid S3 stored in the tank 6 is sucked up by the pump 7 at a specific suction rate while the valves 8 and 9 are opened and then, it is sent to the nozzle 13 through the concentration detector 15. The detector 15 detects the concentration of the reference liquid S3 and sends the concentration data to the data processor 3. The concentration data thus obtained is used for calibration.

The wafer treater section 2 includes a wafer stage 16 on which the semiconductor wafer 12 to be treated is placed and the nozzle 13 which communicates with the liquid chemical supplier section 1. The nozzle 13 and the stage 16 are located in a treatment chamber 17.

The data processor section 3 is comprised of a data converter 10 and a pump controller 11. The data converter 10 is electrically connected to the concentration detector 15 located in the flowing path connecting the wafer treater section 2 with the liquid chemical supplier section 1. The concentration detector 15 outputs a concentration or composition data signal SAD about the liquid chemical SO flowing through the detector 15 to the data converter 10 at each detection timing. The data converter 10 receives the concentration/composition data signal SAD and converts it to a control data signal CLD. The pump controller 11 receives the control data signal CLD and then, sends two control signals CL1 and CL2 to the pumps 5a and 5b in the chemical liquid supplier section 1, respectively, thereby controlling the discharging or pumping rates of the pumps 5a and 5b according to the concentration data signal SAD sent from the detector 15. Thus, the concentration and/or composition of the liquid chemical SO (i.e., the mixture of the two source liquids S1 and S2) is always kept at a desired value or within a desired range.

The concentration detector 15 measures or detects the concentration or composition of the liquid chemical SO or reference liquid S3 by measuring the absorption wavelengths (i.e., the absorption characteristic) of the detection light in the liquid S) or S3 using a known near-infrared, visible, or ultraviolet spectrophotometer.

Figure 4A:
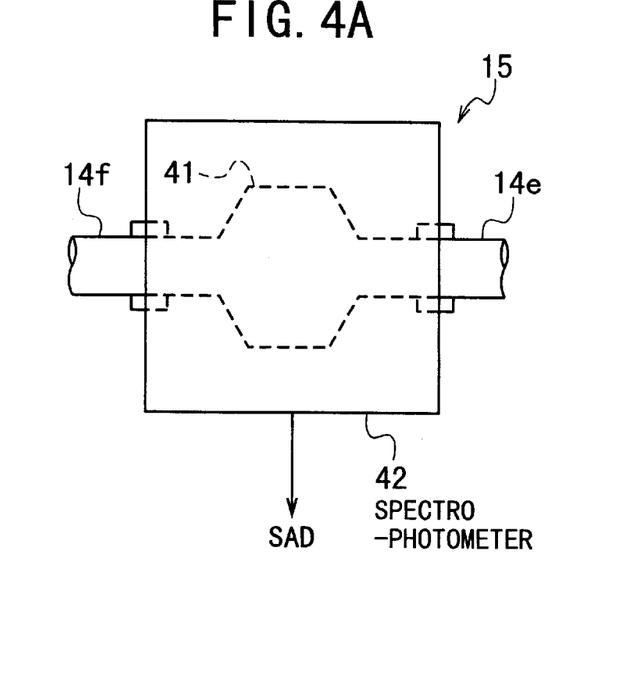
FIG. 4A is a schematic side view of a measurement cell of the spectrophotometer used in the apparatus according to the first embodiment of FIG. 3.
Figure 4B:
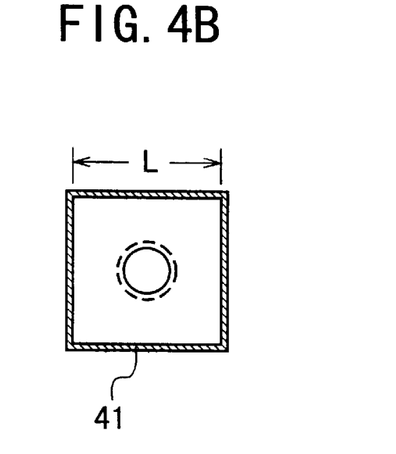
FIG. 4B is a schematic front view of the measurement cell shown in FIG. 4A.

FIGS. 4A and 4B show an example of the measurement cell 41 used in the near-infrared, visible, or ultraviolet spectrophotometer serving as the detector 15. As shown in FIG. 4B, this cell 41 has a square cross-section having four equal side lengths that is equal to the optical path length L of the incident or detection light. The length L is set as a specific value. The two opening ends of the cell 41 are connected to the pipes 14e and 14f, respectively.

Figure 5A:
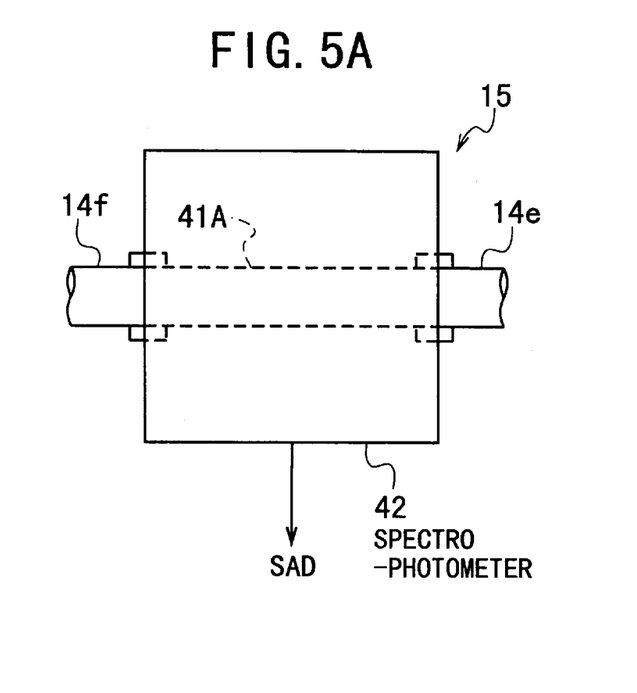
FIG. 5A is a schematic side view of another measurement cell of the spectrophotometer used in the apparatus according to the first embodiment of FIG. 3.
Figure 5B:
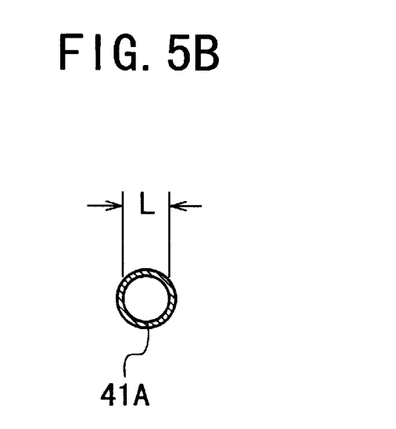
FIG. 5B is a schematic front view of the measurement cell shown in FIG. 5A.

FIGS. 5A and 5B show another example of the measurement cell 41A used in the detector 15. Unlike the cell 41, this cell 41A has a circular cross-section having a diameter that is equal to the optical path length L. The tow opening ends of the cell 41A are connected to the pipes 14e and 14f, respectively.

Each of the cells 41 and 41A is made of a material having no absorption within the near-infrared, visible, or ultraviolet region, a typical one of which is quartz.

If the optical path length L is known and the optical path of the detection light is fixed to penetrate the same position of the cell 41 or 41A, the cross-sectional shape may be circular or polygonal due to the Lambert-Beer Law. This Law states that when monochromatic light propagates through a substance or medium with light-absorption property, the intensity of the light decreases exponentially with respect to the propagation distance through the substance, in other words, the intensity change of the light is expressed by an exponential function with respect to the thickness of the substance and a constant relating to the sort of the substance and the wavelength of the light.

To perform the calibration operation of the concentration or composition of the liquid chemical SO, the reference liquid S3 is used. Specifically, the value 8 is opened and then, the reference liquid S3 is pumped up by the pump 7 while the valve 9 is closed, thereby supplying the liquid S3 to the nozzle 13. At this time, the concentration detector 15 detects the concentration of the reference liquid S3 and sends the concentration data signal SAD to the data processor 3. By comparing the concentration of the liquid chemical SO with that of the reference liquid S3, the concentration calibration can be accomplished.

Figure 6:
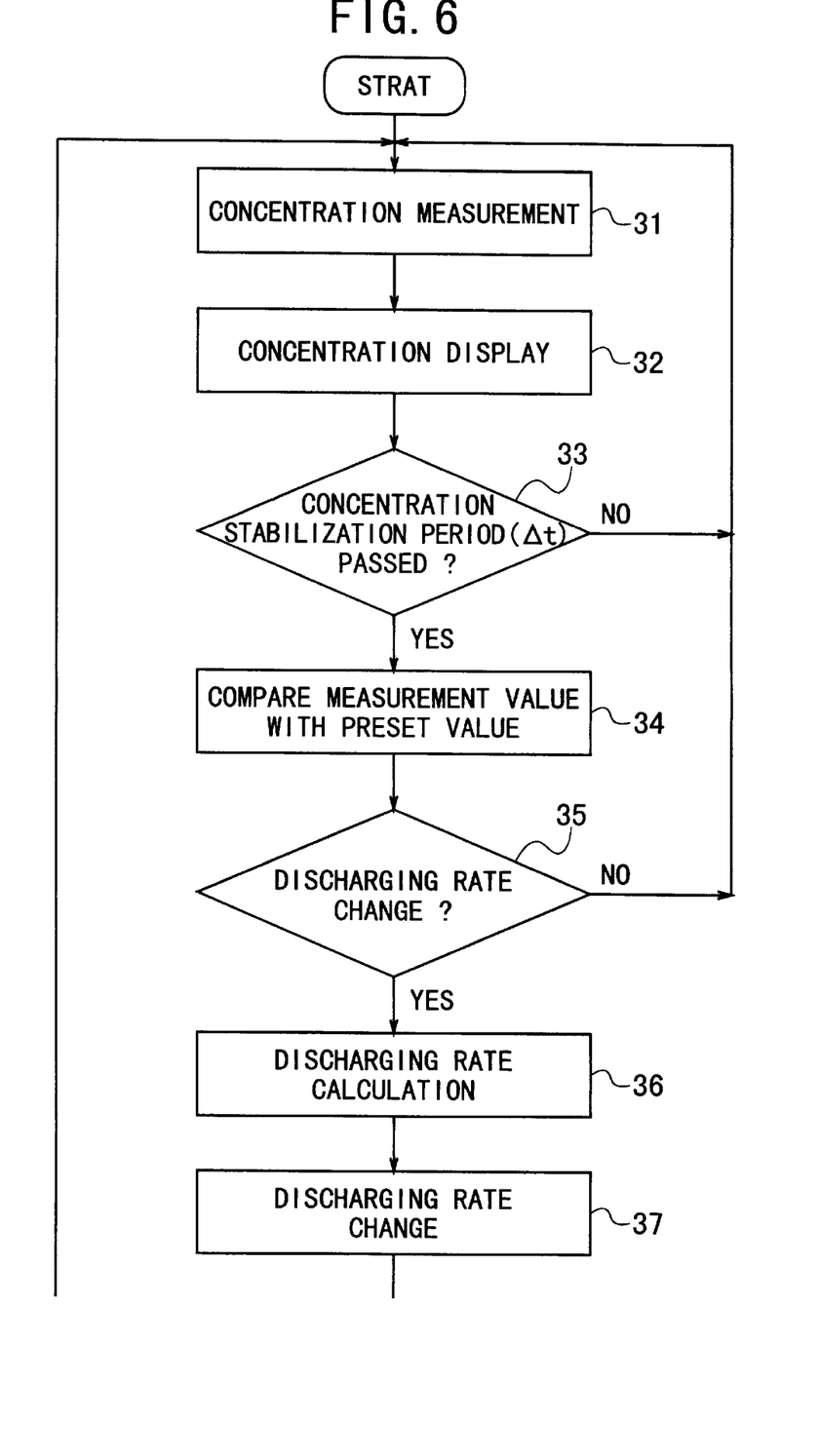
FIG. 6 is a flow chart showing the operation of the concentration control apparatus according to the first embodiment of FIG. 3.

Next, the operation of the concentration control apparatus according to the first embodiment is explained below with reference to FIG. 6.

While the liquid chemical SO is supplied to the wafer treater section 2 through the pipes 14e and 14f, the concentration detector 15 always detects the concentration or composition of the chemical SO flowing through the measurement cell 41 or 41A of the detector 15 and then, it outputs the concentration data signal SAD to the data processor 3 (Step 31). The concentration or composition value obtained by this measurement is displayed on the screen (not shown) of the processor 3 (Step 32).

As seen from FIG. 3, the detector 15 is located apart from the pumps 5a and 5b provided upstream for pumping the source liquids S1 and S2 in the tanks 4a and 4b by a comparatively long distance. Therefore, even if the discharge or pumping rate of the pumps 5a and/or 5b is changed, the concentration change of the liquid chemical SO (i.e., the mixture of the source liquids S1 and S2) occurs after a time lag. Accordingly, it is judged whether or not a specific concentration stabilization period $\Delta t$ has not passed yet, the flow is returned from the step 33 to the step 31. If the time $\Delta t$ has already passed, the next step 34 is carried out, in which the measured concentration value of the liquid chemical SO is compared with its preset value. Then, in the next Step 35, it is judged whether or not the discharging or pumping rate of the pump 5a and/or 5b needs to be changed. If the measured concentration value is included within a specific permissible range, the flow is returned from the step 35 to the step 31. On the other hand, if the measured concentration value is outside the specific permissible range, the next step 36 is carried out in order to increase or decrease the discharging rate of at least one of the pumps 5a and 5b.

Figure 8:
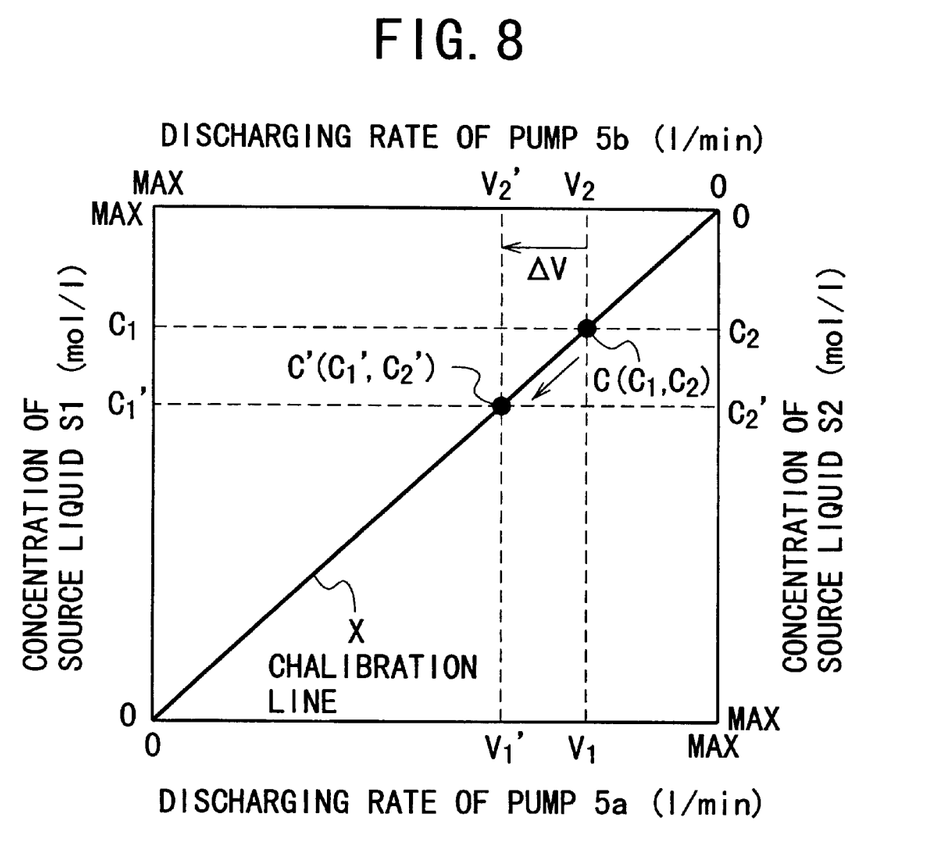
FIG. 8 is a diagram showing the operation of the concentration detector of the concentration control apparatus according to the first embodiment of FIG. 3, in which a calibration curve or line is used.

In the step 36, the discharging rate change of the pumps 5a and/or 5b is accomplished using the calibration line X as shown in FIG. 8. The data of the line X is inputted into the data converter 10 in advance. For example, it is supposed in FIG. 8 that when the discharging rates of the pumps 5a and 5b and $V_1$ and $V_2$, the concentrations of the source liquids S1 and S2 are $C_1$ and $C_2$, respectively. In this case, the concentrations and discharging rates are expressed by the point C, where the ordinates (i.e., the concentrations of the liquids S1 and S2 or their composition ratio) are $C_1$ and $C_2$. Then, if, due to some cause, the concentration of the source liquid S1 is decreased to $C_1'$ and at the same time, that of the source liquid S2 is increased to $C_2'$, the point C is shifted along the calibration line X to the point C', where the concentrations (i.e., the composition ratio) of the liquids S1 and S2 are given as $C_1'$ and $C_2'$. At this point C', the discharging rates of the pumps 5a and 5b are given as $V_1'$ and $V_2'$, respectively. As seen from FIG. 8, the necessary change of the discharging rate of the pump 5a is $-\Delta V$ and that of the pump 5b is $+\Delta V$.

As a result, in the step 37, the data converter 10 of the data processor 3 outputs the control signal CLD reflecting this calibration result to the pump controller 11 and then, the controller 11 outputs the control signals CL1 and CL2 to the pumps 5a and 5b in such a way that the discharging rates of the pumps 5a and 5b are changed to be $V_1'$ and $V_2'$, respectively. Thus, the concentration or composition of the liquid chemical SO can be kept at the preset value or within the preset range.

Figure 7:
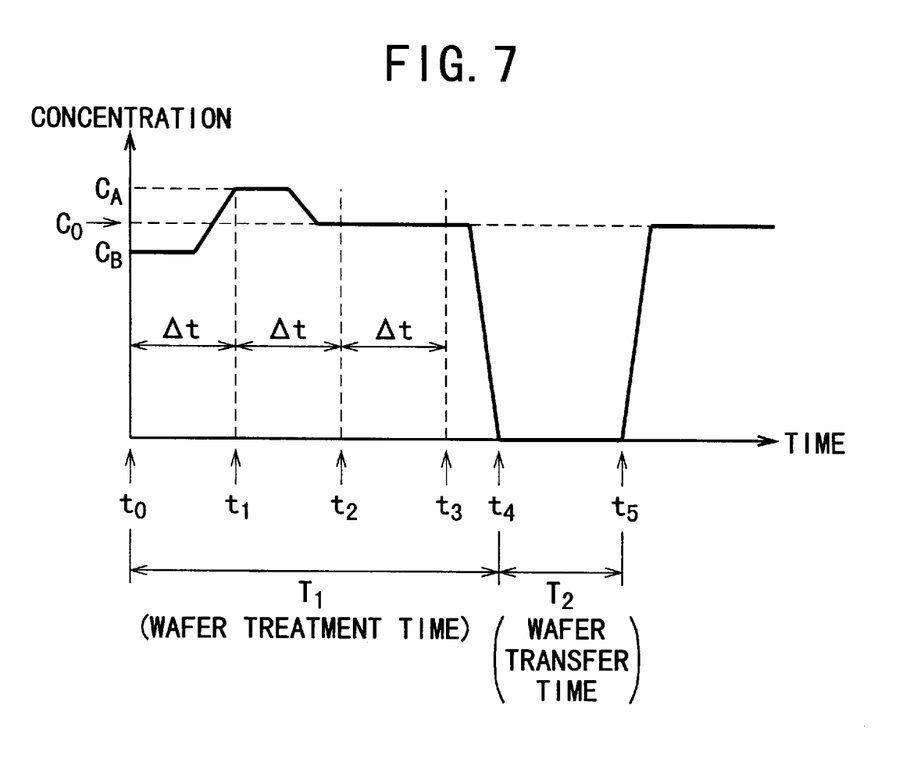
FIG. 7 is a timing diagram showing the operation of the concentration control apparatus according to the first embodiment of FIG. 3, in which the time-dependent change of the concentration of the liquid chemical is shown.

FIG. 7 shows a timing diagram showing the operation of the apparatus according to the first embodiment of FIG. 3.

As seen from FIG. 7, it is supposed that the concentration or composition calibration of the liquid chemical SO is carried out at the time $t_0$. In this case, the same calibration operation occurs at the time $t_1$ after the specific stabilization period $\Delta t$ is passed. During the period $\Delta t$ between the times $t_0$ and $t_1$, the measured concentration is increased from $C_B$ less than the preset concentration value $C_O$ to $C_A$ greater than $C_O$. In this period $\Delta t$, the data converter 10 simply displays the value of the measured concentration or composition of the chemical SO.

Similarly, the same calibration operation occurs at the time $t_2$ after the specific stabilization period $\Delta t$ is passed from $t_1$. During the period $\Delta t$ between the times $t_1$ and $t_2$, the measured concentration is decreased from $C_A$ to $C_B$. In this period $\Delta t$, the data converter 10 simply displays the value of the measured concentration or composition of the chemical SO.

The same calibration operation occurs at the time $t_3$ after the specific stabilization period $\Delta t$ is passed from $t_2$. During the period $\Delta t$ between the times $t_2$ and $t_3$, the measured concentration is kept at the preset value $C_O$. In this period $\Delta t$, the data converter 10 simply displays the value of the measured concentration or composition of the chemical SO.

Between the times $t_4$ and $t_5$, the wafer 12 in the chamber 17 of the wafer treater section 2 is replaced with a new one. Thereafter, the same measurement operation is repeated intermittently.

With the concentration control apparatus of a liquid chemical according to the first embodiment of FIG. 3, the liquid chemical supplier section 1 is connected to the wafer treater section 2, and the concentration detector 15 is located in the communication line between the sections 1 and 2 to detect the concentration and/or composition of the liquid chemical SO flowing through the detector 15. Accordingly, real-time concentration/composition control of the liquid chemical SO can be realized without sampling the same. This solves the sampling-induced problem of the above-described prior-art apparatus shown in FIG. 2.

Also, since the concentration/composition of the liquid chemical SO can be real-time monitored by the concentration detector 15, the deterioration of the liquid chemical SO and the abnormal concentration or composition thereof can be found immediately. This minimizes the damage to be caused by the unallowable concentration and/or composition of the liquid chemical SO.

Furthermore, based on the data signal SAD about the concentration and/or composition of the liquid chemical SO, the data processor section 3 outputs in real time the control signals CL1 and CL2 to the liquid chemical supplier section 1, thereby controlling the concentration and/or composition of the liquid chemical SO supplied from the liquid chemical supplier section 1. As a result, the concentration/composition of the liquid chemical SO can be controlled precisely.

In the apparatus according to the first embodiment, as described above, the mixture of the source liquids S1 and S2 is kept at the desired concentration, resulting in the desired composition of the liquid chemical SO. However, the measured concentration may be simply displayed for monitoring without the concentration adjustment.

SECOND EMBODIMENT

In the concentration control apparatus according to the first embodiment of FIG. 3, the concentration correction of the liquid chemical SO is performed by comparing the concentration of the chemical SO with that of the reference liquid S3. However, it can be realized without using the reference liquid S3 as explained in the following way.

Figure 9:
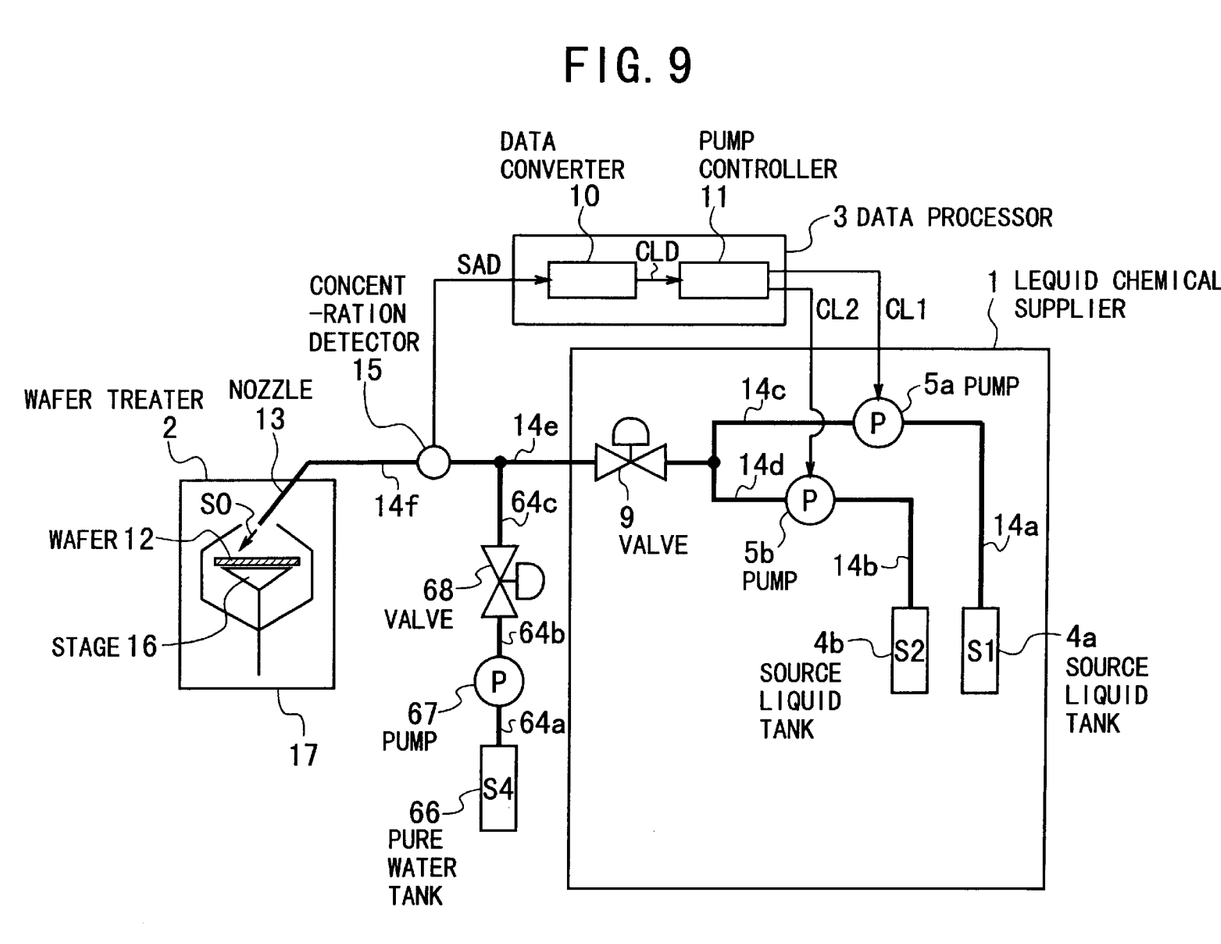
FIG. 9 is a schematic cross-sectional view of a concentration control apparatus of a liquid chemical according to a second embodiment of the present invention.

FIG. 9 shows a concentration control apparatus according to a second embodiment. This apparatus has the same configuration as that of the apparatus according to the first embodiment, except that a pure water tank 66, a pump 67 for sucking the pure water S4 from the tank 66, and a valve 68 for controlling the flow of the pure water S4 are provided, instead of the reference liquid tank 6, the pump 7, and the valve 8. Therefore, the explanation about the same configuration is omitted here by attaching the same reference symbols as those used in the first embodiment to the same elements in FIG. 9.

As seen from FIG. 9, the pure water tank 66, the pump 67, and the valve 68 are located outside the liquid chemical supplier section 1. However, they may be located in the section 1. The tank 66 is connected to the pump 67 through a pipe 64a. The pump 67 is connected to the valve 68 through a pipe 64b. The valve 68 is connected to the pipe 14e communicating with the concentration detector 15.

After the valve 9 is closed, the valve 68 is opened and the pump 67 sucks the pure water S4 from the tank 66, thereby replacing the liquid chemical SO existing in the detector 15 with the pure water S4. Thereafter, the pure water S4 in the detector 15 is evacuated therefrom and the inside of the detector 15 is dried. Subsequently, the detector 15 performs its detection and measurement operations with respect to no liquid, in other words, it carries out so-called "blank measurement". Thus, the concentration/composition calibration of the liquid chemical SO can be attained.

Needless t say, the apparatus according to the second embodiment of FIG. 9 has the same advantages as those in the first embodiment.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A concentration control apparatus of a liquid chemical, comprising:

(a) a liquid chemical supplier section for supplying a liquid chemical; said liquid chemical being a mixture of source liquids, (b) a wafer treater section for applying a specific treatment to a semiconductor wafer using the liquid chemical supplied from said liquid chemical supplying section;

said wafer treating section being connected to said liquid chemical supplying section through a communication line;

(c) a concentration detector located in said communication line for detecting the concentration and/or composition of said liquid chemical flowing through said communication line;

said concentration detector outputting a data signal about said detected concentration and/or composition of said liquid chemical; and (d) a data processor section for processing said data signal outputted from said concentration detector to output control signals to said liquid chemical supplier section;

wherein said concentration and/or composition of said liquid chemical supplied from said liquid chemical supplier section is/are controlled by said control signals outputted from said data processor section, a pump being provided for each source liquid, the source liquids being mixed prior to flowing through a single valve, each pump being controlled by a control signal of said control signals.

2. The apparatus according to claim 1, wherein said liquid chemical is a cleaning liquid for cleaning said semiconductor wafer.

3. The apparatus according to claim 1, wherein said liquid chemical is an etching liquid for etching said semiconductor wafer.

4. The apparatus according to claim 1, wherein said liquid chemical supplier section is comprised of storage tanks for storing said source liquids, and said pumps are respectively connected to said storage tanks;

and wherein said pumps are controlled by said control signals outputted from said data processor section in such a way that said source liquids stored in said tanks are mixed together to have a desired ratio, and said mixture of said source liquids is supplied to said wafer treater section as said liquid chemical.

5. The apparatus according to claim 1, further comprising a reference tank for storing a reference liquid;

wherein said reference liquid is supplied to said concentration detector for calibration.

6. The apparatus according to claim 1, further comprising a pure water tank for storing pure water;

wherein said pure water is supplied to said concentration detector for calibration.

7. The apparatus according to claim 1, wherein said concentration detector measures molarities of said source liquids contained in said liquid chemical by detecting an absorption wavelength or absorption characteristic of said liquid chemical using a ultraviolet, visible, or near-infrared spectrophotometer.

8. The apparatus according to claim 1, wherein said data processor section is comprised of a data converter and a pump controller;

and wherein said data converter converts said data signal about the concentration/composition of said liquid chemical to a control data signal;

and wherein said pump controller controls pumping rates of said source liquids according to said control data signal.

9. The apparatus according to claim 8, wherein said data processor section compares concentrations or composition of said source liquids contained in said liquid chemical with predetermined values, and produces correction values for said source liquids based on result of comparison;

and wherein said pump controller changes said pumping rates of said source liquids according to said correction values.

10. The apparatus according to claim 9, wherein said data processor section has a specific stabilization period of time, and said correction values are produced after said stabilization period passes.

11. The apparatus according to claim 10, wherein said data processor section performs only a displaying operation of concentration values during said stabilization period.

12. The apparatus according to claim 10, wherein said data processor section performs said production operation of said correction values after each stabilization period.

* * * * *